(12) United States Patent
Bajaj et al.

(10) Patent No.: US 11,530,478 B2
(45) Date of Patent: Dec. 20, 2022

(54) METHOD FOR FORMING A HYDROPHOBIC AND ICEPHOBIC COATING

(71) Applicant: Applied Materials, Inc., Santa Clara, CA (US)

(72) Inventors: Rajeev Bajaj, Fremont, CA (US); Mei Chang, Saratoga, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 66 days.

(21) Appl. No.: 16/795,431

(22) Filed: Feb. 19, 2020

(65) Prior Publication Data

US 2020/0299834 A1  Sep. 24, 2020

Related U.S. Application Data

(60) Provisional application No. 62/820,648, filed on Mar. 19, 2019.

(51) Int. Cl.
*C23C 16/30* (2006.01)
*C23C 16/44* (2006.01)

(52) U.S. Cl.
CPC .............. *C23C 16/30* (2013.01); *C23C 16/44* (2013.01)

(58) Field of Classification Search
CPC ....... C23C 16/30; C23C 16/32; C23C 16/325; C23C 16/40; C23C 16/401; C23C 16/402
See application file for complete search history.

(56) References Cited

U.S. PATENT DOCUMENTS

| | | | |
|---|---|---|---|
| 2,599,066 | A | 6/1952 | Osborn |
| 2,690,928 | A | 10/1954 | Boynes |
| 3,046,048 | A | 7/1962 | Cheney |
| 4,336,644 | A | 6/1982 | Medlin |
| 5,037,156 | A | 8/1991 | Lundberg |
| 5,188,887 | A | 2/1993 | Linge et al. |
| 5,214,008 | A | 5/1993 | Beckwith et al. |
| 5,229,194 | A | 7/1993 | Lingle et al. |
| 5,242,560 | A | 9/1993 | Lingle et al. |

(Continued)

FOREIGN PATENT DOCUMENTS

| | | |
|---|---|---|
| CN | 106291778 B | 3/2018 |
| JP | H05319871 A | 12/1993 |

(Continued)

OTHER PUBLICATIONS

Vakifahmetoglu, Cekdar, et al., "Gradient-Hierarchic-Aligned Porosity SiOC Ceramics". Scientific Reports, 7:41049, pp. 1-12. DOI: 10.1038/srep41049.*

(Continued)

*Primary Examiner* — Bret P Chen
(74) *Attorney, Agent, or Firm* — Patterson + Sheridan, LLP

(57) ABSTRACT

A method of depositing a coating and a layered structure is provided. A coating is deposited on a substrate to make a layered structure, such that an interface between the coating and the substrate is formed. The coating includes silicon, oxygen, and carbon, where the carbon doping in the coating increases between the interface and the top surface of the coating. The top surface of the coating is inherently hydrophobic and icephobic, and reduces the wetting of water or ice film on the layered structure, without requiring reapplication of the coating.

18 Claims, 3 Drawing Sheets

(56) References Cited

U.S. PATENT DOCUMENTS

| | | | |
|---|---|---|---|
| 5,298,048 | A | 3/1994 | Lingle et al. |
| 5,344,718 | A | 9/1994 | Hartig et al. |
| 5,376,455 | A | 12/1994 | Hartig et al. |
| 5,425,861 | A | 6/1995 | Hartig et al. |
| 5,514,476 | A | 5/1996 | Hartig et al. |
| 5,557,462 | A | 9/1996 | Hartig et al. |
| 5,615,923 | A | 4/1997 | Madison |
| 5,637,353 | A | 6/1997 | Kimock et al. |
| 5,646,781 | A | 7/1997 | Johnson, Jr. |
| 5,665,424 | A | 9/1997 | Sherman |
| 5,700,321 | A | 12/1997 | Niikura |
| 5,800,933 | A | 9/1998 | Hartig et al. |
| 5,837,108 | A | 11/1998 | Lingle et al. |
| 5,877,103 | A | 3/1999 | Dupont et al. |
| 5,926,740 | A * | 7/1999 | Forbes .................. H01L 29/78 438/763 |
| 6,017,609 | A | 1/2000 | Akamatsu et al. |
| 6,249,378 | B1 | 6/2001 | Shimamura et al. |
| 6,303,963 | B1 | 10/2001 | Ohtani et al. |
| 6,338,901 | B1 * | 1/2002 | Veerasamy ......... C03C 17/3652 428/408 |
| 6,410,368 | B1 | 6/2002 | Kawasaki et al. |
| 6,746,965 | B2 | 6/2004 | Uehara et al. |
| 6,773,944 | B2 | 8/2004 | Okamoto |
| 6,872,452 | B2 | 3/2005 | Taninaka et al. |
| 7,049,004 | B2 | 5/2006 | Domash et al. |
| 7,212,336 | B2 | 5/2007 | Chen et al. |
| 7,632,538 | B2 | 12/2009 | Veerasamy |
| 7,749,622 | B2 | 7/2010 | Yamada et al. |
| 7,931,325 | B2 | 4/2011 | Robbins |
| 8,299,400 | B2 | 10/2012 | Prone et al. |
| 8,327,496 | B2 | 12/2012 | Kim |
| 8,362,399 | B2 | 1/2013 | Seaborn |
| 8,795,042 | B2 | 8/2014 | Ueda et al. |
| 8,866,047 | B1 | 10/2014 | Parker |
| 9,261,634 | B2 | 2/2016 | Hendrix et al. |
| 9,268,072 | B2 | 2/2016 | Hasegawa et al. |
| 9,354,369 | B2 | 5/2016 | Hendrix et al. |
| 9,714,308 | B2 | 7/2017 | Guillemot et al. |
| 2001/0034089 | A1 | 10/2001 | Yamazaki et al. |
| 2004/0002208 | A1 * | 1/2004 | Takigawa .......... H01L 21/02304 438/624 |
| 2004/0048490 | A1 * | 3/2004 | Tsuji ................. H01L 21/02274 257/E21.583 |
| 2005/0025035 | A1 * | 2/2005 | Nakai .................. G11B 7/2578 369/275.2 |
| 2005/0242714 | A1 * | 11/2005 | Chung ................ H01L 27/3283 313/504 |
| 2006/0154493 | A1 * | 7/2006 | Arghavani ........ H01L 21/02211 438/786 |
| 2007/0190769 | A1 * | 8/2007 | Ang .................... H01L 21/7684 438/597 |
| 2010/0221489 | A1 | 9/2010 | Lappalainen et al. |
| 2011/0305874 | A1 * | 12/2011 | Thoumazet ........... C04B 41/009 428/172 |
| 2013/0222754 | A1 * | 8/2013 | Kohtoku ................ H01T 23/00 349/161 |
| 2014/0349107 | A1 * | 11/2014 | Thoumazet ........... C23C 16/325 204/192.15 |
| 2016/0079056 | A1 * | 3/2016 | Harada ............. H01L 21/02274 118/725 |
| 2017/0005041 | A1 * | 1/2017 | Ren ................... H01L 21/76832 428/408 |

FOREIGN PATENT DOCUMENTS

| | | | |
|---|---|---|---|
| JP | H11129382 | A | 5/1999 |
| JP | 2929779 | B2 | 8/1999 |
| JP | 3387141 | B2 | 3/2003 |
| JP | 2003/257865 | A | 9/2003 |
| WO | 200136342 | A2 | 5/2001 |
| WO | WO 2010/079299 | A1 * | 7/2010 ............. C03C 17/42 |

OTHER PUBLICATIONS

Hegemann, D., et al., "Design of functional coatings". J. Vac. Sci. Technol. A 23(1), Jan./Feb. 2005, pp. 5-11.*

Oh, Teresa, et al., "Comparison between SiOC Thin Films Fabricated by Using Plasma Enhance Chemical Vapor Deposition and SiO2 Thin Films by Using Fourier Transform Infrared Spectroscopy". Journal of the Korean Physical Society, vol. 56, No. 4, Apr. 2010, pp. 1150-1155.*

Nakaya, Masaki, et al., "Impact of hot wire and material gas species on the Cat-CVD coating of gas barrier SiOC thin films onto PET bottles". Surface and Coatings Technology, 344 (2018) 21-29.*

Szymanowski, Hieronim, et al., "Impact of hotwire and material gas species on the Cat-CVD coating of gas barrier SiOC thin films onto PET bottles". Coatings 2020, 10, 794, pp. 1-23.*

Choi, W.K., et al., "Structural study of plasma enhanced chemical vapour deposited silicon carbide films". Materials Science & Engineering B75 (2000) 174-176.*

Xiao, Jian-Rong, et al., "Effect of radio frequency power on the structural and optical properties of nitrogen doping of fluorinated diamond-like carbon thin films". J. Phys. D: Appl. Phys. 41 (2008) 225304 pp. 1-5.*

Che, Xing-Sen, et al., "Effects of radio frequency power on the optical and electrical properties of germanium carbon films". Journal of Alloys and Compounds, vol. 577, Nov. 15, 2013, pp. 15-18.*

Kim, Sung Hyun, et al., "Effects of carbon concentration on high-hardness plasma-polymer-fluorocarbon film deposited by mid-range frequency sputtering". Scientific Reports (2019) 9: 10664, pp. 1-8.*

Wang, Yongchao, et al., "Gradient structure high emissivity MoSi2—SiO2—SiOC coating for thermal protective application". Journal of Alloys and Compounds 703 (2017) 437-447.*

Szymanowski, Hieronim, et al., "Thin SiNC/SiOC Coatings with a Gradient of Refractive Index Deposited from Organosilicon Precursor". Coatings 2020, 10, 794, pp. 1-23.*

Vakifahmetoglu, Cekdar, et al., "Gradient-Hierarchic-Aligned Porosity SiOC Ceramics". Scientific Reports | 7:41049, pp. 1-12.*

Uznanski, Pawel, et al., "Surface modification of silicon oxycarbide films produced by remote hydrogen microwave plasma chemical vapour deposition from tetramethyldisiloxane precursor". Surface and Coatings Technology 350 (2018) 686-698.*

Rao, The Effectiveness of Silane and Siloxane Treatments on the Superhydrophobicity and Icephobicity of Concrete Surfaces, PhD Thesis, 1-118.

International Search Report and Written Opinion of the International Searching Authority for PCT/US2020/018886 dated Jun. 18, 2020, 9 pages.

Japanese Office Action dated Oct. 25, 2022 for Application No. 2021-556224.

* cited by examiner

METHOD FOR FORMING A HYDROPHOBIC AND ICEPHOBIC COATING

CROSS-REFERENCE TO RELATED APPLICATIONS

This application claims priority to U.S. Provisional Patent Application No. 62/820,648, filed Mar. 19, 2019, which is hereby incorporated by reference in its entirety.

BACKGROUND

Field

Embodiments of the invention relate to a method and an article of manufacture and, more specifically, to a method of depositing a hydrophobic and icephobic coating.

Description of the Related Art

Glass surfaces are hydrophilic by nature, such that glass surfaces tend to attract water, resulting in formation of a water film or ice film on the surface. In snowy, winter weather, cars and other vehicles accumulate ice, which is especially problematic on windshields, windows and other viewing surfaces. Additionally, during rain, water films forming on windshields impair visibility during driving.

In order to combat this issue, current solutions in the marketplace include heated windshield wipers to help melt snow, and sheets of plastic to cover the windshields to prevent snow formation. However, heated windshield wipers are energy intensive, take a long time to remove snow, and often convert snow into hard ice before final removal. Plastic sheet covers have to be repeatedly applied and removed and often trap ice underneath.

Silicone based liquid formulations are found in the art, which prevent ice and snow buildup by providing a temporary hydrophobic coating, lessening the sticking of ice and snow to the windshield or other glass surfaces. One drawback of these coatings is that the coatings are temporary and have to be reapplied every few weeks, making them costly and time consuming.

Therefore, there is a need for long-lasting hydrophobic and icephobic coating of windshields and other glass surfaces.

SUMMARY

In one embodiment, a method of depositing a coating is provided, including depositing the coating on a substrate, the coating including silicon (Si), oxygen (O), and carbon (C). The substrate is at least partially transparent to visible light. The coating is deposited such that an interface is formed between the substrate and the coating. The concentration of C in the coating is larger at a top surface of the coating than the interface. The top surface of the coating is disposed on the opposite side of the coating than the interface.

In another embodiment, a method of depositing a coating is provided, including depositing the coating on a substrate, the coating including silicon (Si), oxygen (O), and carbon (C). The substrate is at least partially transparent to visible light. The coating is deposited such that an interface is formed between the substrate and the coating. The concentration of C in the coating is larger at a top surface of the coating than the interface. The top surface of the coating is disposed on the opposite side of the coating than the interface. The concentration of C in the coating ranges from about 3 atomic percent to about 25 atomic percent.

In another embodiment, a layered structure is provided, including a substrate and a coating disposed over the substrate. The coating includes silicon (Si), oxygen (O), and carbon (C). The substrate is at least partially transparent to visible light. The coating is deposited such that an interface is formed between the substrate and the coating. The concentration of C in the coating is larger at a top surface of the coating than the interface. The top surface of the coating is disposed on the opposite side of the coating than the interface.

The top surface of the coating in the layered structure is inherently hydrophobic and icephobic, and thus the coating at least partially prevents the wetting of a water or ice film on the surface of the layered structure. The coating does not to be periodically replaced, and thus the substrate, such as a windshield or window, does not need to be retreated.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a method of coating a substrate, and a layered structure created by coating the substrate. A coating including silicon (Si), oxygen (O), and carbon (C) is deposited on a substrate. The top surface of the coating is inherently hydrophobic and icephobic. There is a variation in C doping in the coating, so that unwanted reflections, refractions, or diffusion of visible light through the layered structure is not negatively affected by the coating. In addition, the gradual variation of C doping through the coating allows for good adhesion at the interface between the surface and the coating. Embodiments of the disclosure provided herein may be especially useful for, but are not limited to, a method of depositing a coating on a substrate transparent to visible light.

As used herein, the term "about" refers to a +/−10% variation from the nominal value. It is to be understood that such a variation can be included in any value provided herein.

Figure 1:
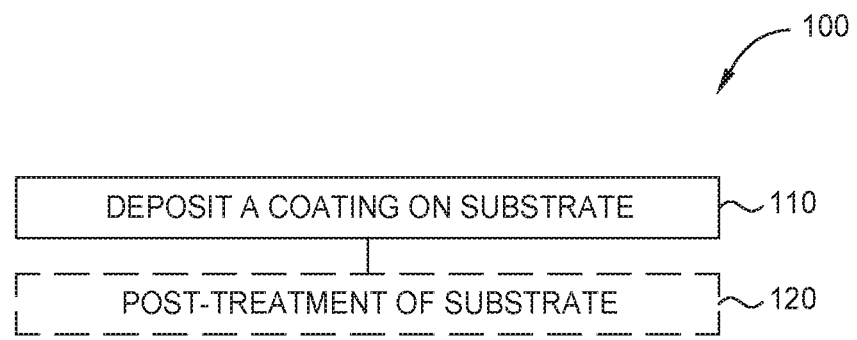
FIG. 1 is a flow diagram of method operations for depositing a coating on a substrate, according to one embodiment.
Figure 2A:
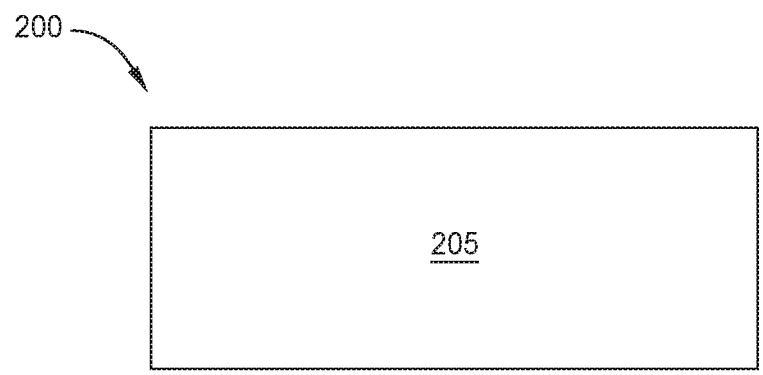
FIG. 2A illustrates a layered structure, according to one embodiment.

FIG. 1 is a flow diagram of method operations 100 for depositing a coating on a substrate to create a layered structure, according to one embodiment. Although the method operations are described in connection with FIGS. 1 and 2A-C, persons skilled in the art will understand that any system configured to perform the method operations, in any order, falls within the scope of the embodiments described herein. FIG. 2A illustrates a layered structure 200, according to one embodiment. The layered structure 200 includes a substrate 205. The substrate 205 includes silicon (Si) and oxygen (O), according to one embodiment. The substrate 205 allows the passage of at least a portion of the spectrum of visible light. The substrate can include glass. The substrate 205 can be an optical lens of any kind, including a lens for magnifying or correcting any aberration of an image, such as spherical or chromatic aberrations. The substrate 205 can be a lens for eyeglasses or goggles. The substrate 205 can be a layered structure, and can include layers or other features for partially or completely blocking a spectrum of light, such as infrared, ultraviolet, and the like.

The substrate 205 is a windshield for a vehicle, according to one embodiment. The substrate 205 is a side or rear window for a vehicle, according to one embodiment. The vehicle can be, but is not limited to, a car, a truck, a motorcycle, a boat, a ship, a scooter, a train, an amphibious vehicle, an aircraft, an airplane, a helicopter, a spacecraft, and the like. The substrate 205 is a window for a building, a permanent structure, or a temporary structure, according to one embodiment.

Figure 2B:
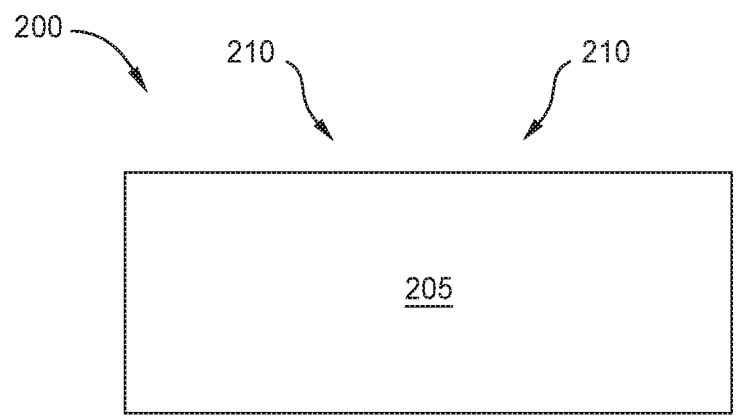
FIG. 2B illustrates the layered structure of FIG. 2A during deposition of a coating, according to one embodiment.

Referring to FIGS. 1 and 2A-C, the method begins at operation 110, where a coating 215 is deposited on the substrate 205. FIG. 2B illustrates the layered structure 200 of FIG. 2A during deposition of the coating 215, according to one embodiment. The coating 215 can be deposited by any conventional deposition process 210, such as, but not limited to, atomic layer deposition (ALD), physical vapor deposition (PVD), and chemical vapor deposition (CVD). The deposition process 210 can be performed in any conventional deposition chamber (not shown). The precursors can be any precursor or combination of precursors that contain carbon, oxygen, and silicon. The deposition process 210 can be performed at a temperature from between about 300° C. to about 450° C. The process can be performed from about 60 seconds to about 10 minutes. A radio frequency (RF) can be applied with an RF power of about 400 W to about 800 W. Pressure of the chamber (not shown) can be maintained at about 5 Torr to about 10 Torr. A neutral gas, such as argon (Ar) or helium (He), can be co-flowed during deposition at a flow rate of about 2000 sccm to about 5000 sccm.

In one embodiment, the deposition process 210 is CVD, the precursors are octamethylcyclotetrasiloxane (OMCTS), methane ($CH_3$), and oxygen gas ($O_2$), oxygen gas is provided at a flow rate of about 50 sccm to about 200 sccm, helium gas (He) is co-flowed during deposition at a flow rate of about 2000 sccm to about 5000 sccm, pressure of the chamber (not shown) can be maintained at about 5 Torr to about 10 Torr, and the process is performed at a temperature of about 350° C., with an applied RF power of about 400 W to about 800 W. Carbon in the coating 215 is deposited at rate of about 4000 Å/min to about 5000 Å/min. Higher RF power leads to lower carbon content, so in one embodiment, growth of the interface 225 is performed at a higher RF power, which is then gradually reduced during the course of deposition to form a variation in the carbon content of the coating 215.

The coating 215 includes silicon (Si), oxygen (O), and carbon (C). The coating can also include hydrogen (H). An interface 225 is formed through chemical bonding between the coating 215 and the substrate 205. The C can bond to Si, substituting O, by forming terminal methyl groups ($-CH_3$). The C can substitute for 0 in the bonded Si—O network by forming methylene bridges ($-CH_2-$) between Si atoms, or the C can substitute for Si in the bonded Si—O network as C. The aforementioned C groups are also located at the top surface 215S of the coating 215, and the C groups reduce contact angle of water droplets disposed on the top surface. The top surface 215S is inherently hydrophobic, such that water contact angles of water droplets is between about 90° to about 120°, according to one embodiment. The top surface 215S is also icephobic, such that ice is at least partially prevented from forming on the top surface.

It is known in the art that hydrophobic and icephobic surfaces at least partially prevent the sticking of water and ice to the surface via water or ice film growth, which makes removal of water and ice easier. A water contact angle of water droplets between about 90° to about 120° leads to about 50% of the ice or water sticking to the surface of a material. Thus, the top surface 215S reduces the wetting of a water film or an ice film. The top surface 215S is hydrophobic and icephobic as deposited, and thus does not require retreating, which results in decreased cost and time for the user.

The coating 215 includes from above about 0 atomic percentage of C to below about 40 atomic percentage of C, such as about 3 atomic percentage of C to about 25 atomic percentage of C, preferably about 2 atomic percentage of C to about 12 atomic percent carbon, according to one embodiment. The C concentration in the coating 215 is variable, such that the concentration of C in the coating is larger at the interface 225 than at a top surface 215S of the coating, wherein the top surface of the coating is disposed on the opposite side of the coating than the interface. The variation of concentration of C in the coating 215 is substantially linear between the interface 225 and the top surface 215S, according to one embodiment. The gradual variation of concentration of C allows for a smooth variance in the index of refraction of the coating 215, preventing large amounts of light from being reflected, refracted, diffracted, or otherwise undesirably altered, so as to provide unimpeded vision through the layered structure 200. Thus, the index of refraction of the substrate 205 and the layered structure 200 can be similar.

The gradual variation of concentration of C allows for a clean interface 225 between the substrate 205 and the coating 215, preventing formation of vacancies or interstitial atoms at the interface which cause unwanted reflection, refraction, or diffraction of light through the layered structure 200. In this manner, the concentration of C in the coating 215 gradually increases until it reaches its desired value at the top surface 215S, which is below about 25 atomic percentage of C, preferably about 3 atomic percentage of C to about 12 atomic percentage of C, and the C groups present at the top surface contribute to the hydrophobicity and icephobicity of the coating. The thickness of the coating 215 is from about 100 Å to about 10 µm, preferably from about 100 Å to about 5 µm, according to one embodiment. Thinner coatings 215 are preferable, as there is minimal impact to optical or "see thru" performance of glass, but too thin of coatings can wear off over time due to mechanical wear from erosion or windshield wiper or other cleaning operations, leading to growing the coating at a thickness as descried above.

The layered structure 200 has an acceptable bulk modulus and hardness so that the layered structure has acceptable strength for the purpose of the layered structure, e.g., strong enough for use as a windshield or side window in vehicles. The bulk modulus of the layered structure 200 can vary between about 5 GPa to about 40 GPa, and the hardness of the layered structure can vary between about 1 GPa to about 10 GPa, depending on the use of the layered structure as a windshield or window. The refractive index of the coating 215 is similar to the substrate 205, or the difference is minimal for ideal optical performance. The index of refraction for glass is about 1.45, and the refractive index of the coating 215 is expected to be lower, a gradual change in refractive index while minimizing total film thickness will result in ideal optical performance. The maximum difference in refractive indices should be maintained below about 0.2, in order to maintain desired optical performance of the layered structure 200.

Figure 2C:
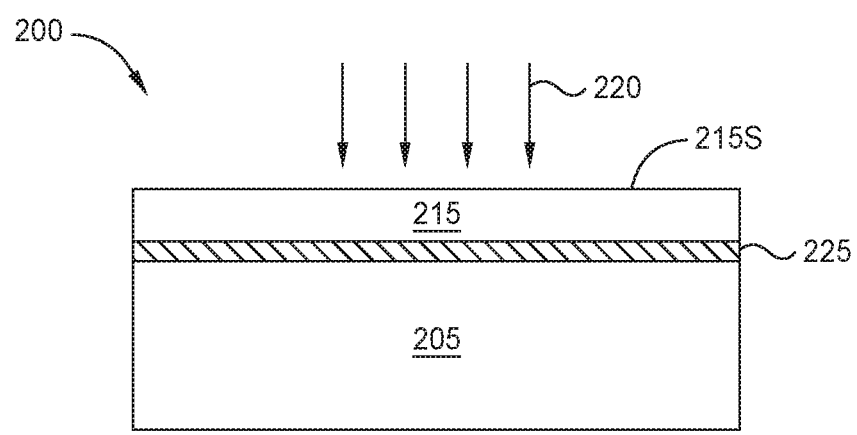
FIG. 2C illustrates the layered structure of FIG. 2B undergoing post-treatment, according to one embodiment.

At optional operation 120, a post-treatment 220 is applied to the layered structure 200. The post-treatment 220 can include an anneal, a bake, a chemical etch, a chemical cleaning process, or any combination of the above, performed either sequentially or simultaneously. FIG. 2C illustrates the layered structure 200 of FIG. 2B undergoing post-treatment 220, according to one embodiment. The post-treatment 220 improves uniformity of the coating 215, heals atomic vacancies in the coating, the substrate 205, and the interface 225, ensures a smoother interface between the substrate and the coating, and improves top surface 215S smoothness, all of which improves the optical and structural properties of the layered structure 200.

The layered structure 200 can include multiple layers of substrates 205 and coatings 215. A film can be grown on a layered structure 200, and the film becomes the new substrate 205 upon which method 100 can be performed. In this manner, the method 100 can be performed repeatedly, resulting in multiple layers of substrates 205 and coatings 215. A vacuum or air gap can be present between iterations of the layered structure 200, as in, for example, double pane windows or windshields. The layered structure 200 can be laminated glass, and the iterations of substrates 205 and coatings 215 can be separated by an interlayer, so that the layered structure holds together when shattered. The interlayer can include polyvinyl butyral (PVB), ethylene-vinyl acetate (EVA), polybutylene terephthalate (PBT), or the like.

Figure 3:
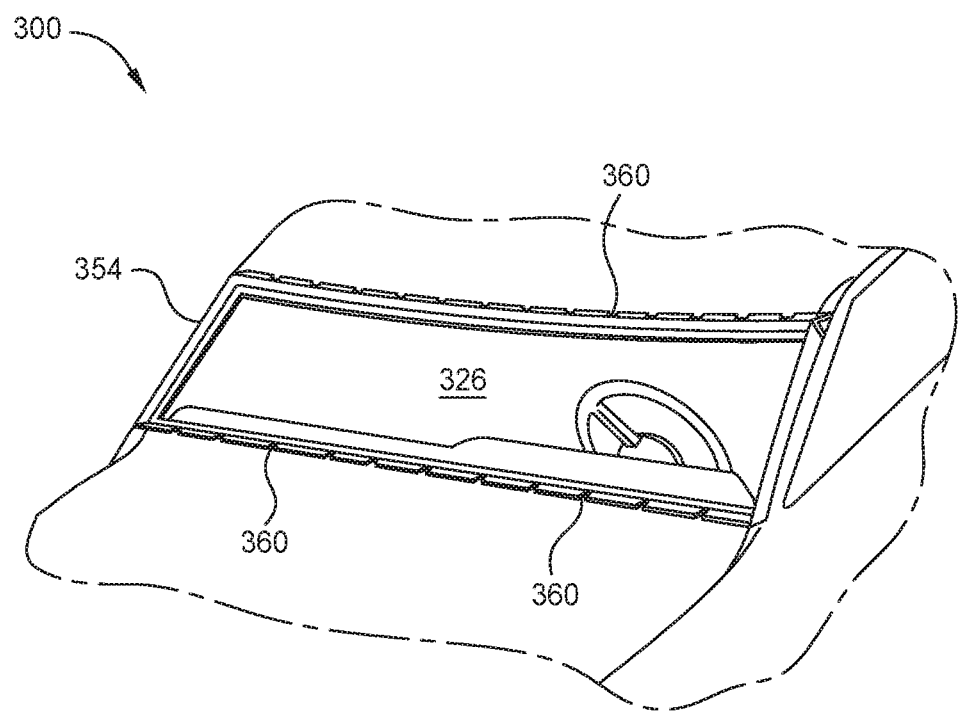
FIG. 3 illustrates a treated windshield in a car, according to one embodiment.

FIG. 3 illustrates a treated windshield 326 in a vehicle 300, according to one embodiment. Although FIG. 3 shows the vehicle 300 is a car, the vehicle can be any of the vehicles presented above, although not limited solely to the vehicles presented above. The windshield frame 354 is disposed in an aperture in the vehicle 300, and the treated windshield 326 is attached to the windshield frame by fasteners 360. The fasteners 360 can be any used in the art to fasten windshields to the vehicle 300 in the art, such as clips, molding, weather stripping, and the like. The substrate 205 is a conventional windshield, and thus the treated windshield 326 is the layered structure 200, according to one embodiment, and the coating 215 increases the hydrophobicity and icephobicity of the treated windshield surface. The coating 215 prevents build-up of ice and snow, and allows for easier removal of the ice and snow from windshield wipers. The small thickness of the coating 215 in comparison to the thickness of a conventional windshield allows the coating to be applied to a conventional windshield without necessitating redesign or further engineering of the windshield, since the small thickness of the coating does not interfere with many designs of fastening windshields to vehicles.

As described above, a coating 215 is deposited on a substrate 205 to make a layered structure 200. The substrate 205 can be a windshield, and thus the layered structure 200 is a treated windshield 326. The coating 215 includes silicon, oxygen, and carbon, where the carbon doping in the coating increases between the interface 225 and the top surface 215S of the coating.

The top surface 215S of the coating 215 is inherently hydrophobic and icephobic, and reduces the wetting of water or ice film on the layered structure 200, without requiring reapplication of the coating. The coating 215 can be deposited on conventional glass substrates 205, such as a windshield or window. The gradual variation in carbon concentrations in the coating 215 results in slowly varying index of refraction, which reduces unwanted refraction, reflection, or diffraction of light passing through the layered structure 200.

While the foregoing is directed to implementations of the present invention, other and further implementations of the invention may be devised without departing from the basic scope thereof, and the scope thereof is determined by the claims that follow.

We claim:

1. A method of depositing a coating, comprising:
depositing the coating on a substrate, wherein:
the substrate is at least partially transparent to visible light,
the coating comprises silicon (Si), oxygen (O), and carbon (C),
the coating is deposited such that an interface is formed between the substrate and the coating,
a concentration of C in the coating is greater at a top surface of the coating than the interface, wherein a variation of concentration of C in the coating is substantially linear between the interface and the top surface, wherein the concentration of C in the coating is increased by reducing a radiofrequency power as the coating is deposited from the interface to the top surface, and
the top surface of the coating is disposed on the opposite side of the coating than the interface.

2. The method of claim 1, further comprising post-treating the coating after the depositing the coating on the substrate.

3. The method of claim 1, wherein the concentration of C in the coating ranges from 0 atomic percent to less than 40 atomic percent.

4. The method of claim 1, wherein the substrate comprises Si and O.

5. The method of claim 1, wherein the depositing the coating on the substrate comprises chemical vapor deposition (CVD).

6. The method of claim 1, wherein the coating is deposited such that a plurality of water droplets disposed on the top surface of the coating make a water contact angle with the top surface of about 90° to about 120°.

7. The method of claim 1, wherein the coating has a hardness of 1 GPa to 10 GPa.

8. The method of claim 1, wherein the coating has a bulk modulus of 5 GPa to 40 GPa.

9. A method of depositing a coating, comprising:
exposing a substrate to a gas mixture comprising a silicon-containing precursor, an oxygen-containing precursor, and a carbon-containing precursor, wherein the substrate is at least partially transparent to visible light;
applying a first radio frequency power to the gas mixture;

forming an interface of the coating on the substrate, the interface comprising silicon (Si), oxygen (O), and a first concentration carbon (C); and reducing the first radio frequency power to a second radio frequency applied to the gas mixture to increase a concentration of C to a second concentration of C at a top surface of the coating.

10. The method of claim 9, wherein a thickness of the coating is from about 1000 Å to about 10 μm.

11. The method of claim 9, wherein the substrate comprises Si and O.

12. The method of claim 9, wherein exposing the substrate to a gas mixture comprises chemical vapor deposition (CVD).

13. The method of claim 9, wherein a variation of concentration of C in the coating is substantially linear between the interface and the top surface.

14. The method of claim 9, wherein the coating is deposited such that a plurality of water droplets disposed on the top surface of the coating make a water contact angle with the top surface of about 90° to about 120°.

15. The method of claim 9, wherein the concentration of C in the coating ranges from about 3 atomic percent to about 25 atomic percent.

16. The method of claim 9, wherein the first radiofrequency power is about 400 W to about 800 W.

17. The method of claim 9, further comprising: forming a second substrate above the coating, the second substrate and the coating separated by a non-zero distance or an interlayer.

18. The method of claim 17, further comprising forming a second coating over the second substrate.

* * * * *